(12) United States Patent
Li et al.

(10) Patent No.: US 12,419,105 B2
(45) Date of Patent: Sep. 16, 2025

(54) PROTECTION RING, METHOD FOR FORMING PROTECTION RING, AND SEMICONDUCTOR STRUCTURE

(71) Applicant: CHANGXIN MEMORY TECHNOLOGIES, INC., Hefei (CN)

(72) Inventors: Xin Li, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 574 days.

(21) Appl. No.: 17/851,673

(22) Filed: Jun. 28, 2022

(65) Prior Publication Data

US 2023/0197529 A1 Jun. 22, 2023

Related U.S. Application Data

(63) Continuation of application No. PCT/CN2022/082013, filed on Mar. 21, 2022.

(30) Foreign Application Priority Data

Dec. 20, 2021 (CN) .......................... 202111563365.1

(51) Int. Cl.
*H10D 86/01* (2025.01)

(52) U.S. Cl.
CPC .................................. *H10D 86/01* (2025.01)

(58) Field of Classification Search
CPC .. H10B 12/01; H10B 12/033; H10B 12/0335; H10B 12/053; H10B 12/31; H10B 12/315; H10B 12/34; H10B 12/488; H10D 86/01; H01L 23/535; H01L 23/552; H01L 23/562; H01L 23/564; H01L 23/585
See application file for complete search history.

(56) References Cited

U.S. PATENT DOCUMENTS

| | | | |
|---|---|---|---|
| 6,815,821 B2 | 11/2004 | Yu | |
| 9,397,032 B2 | 7/2016 | Lu | |
| 9,947,627 B2 | 4/2018 | Lu | |
| 10,170,435 B2 | 1/2019 | Lu | |
| 2014/0070416 A1 | 3/2014 | Lu et al. | |
| 2015/0102395 A1* | 4/2015 | Park | H10D 1/665 257/301 |
| 2016/0211227 A1* | 7/2016 | Wagner | H01L 23/562 |
| 2016/0300801 A1 | 10/2016 | Lu et al. | |
| 2018/0190597 A1 | 7/2018 | Lu et al. | |

FOREIGN PATENT DOCUMENTS

| | | |
|---|---|---|
| CN | 103811471 A | 5/2014 |
| CN | 103887284 A | 6/2014 |
| CN | 107946350 A | 4/2018 |
| CN | 108010958 A | 5/2018 |
| CN | 109037157 A | 12/2018 |
| JP | 2012009645 A | 1/2012 |

* cited by examiner

*Primary Examiner* — Nelson Garces
(74) *Attorney, Agent, or Firm* — SYNCODA LLC; Feng Ma

(57) ABSTRACT

A protection ring, a method for forming a protection ring, and a semiconductor structure are provided. The protection ring at least includes a buried protection structure. The buried protection structure is arranged in a semiconductor substrate. The buried protection structure is configured to protect a first functional structure formed inside the semiconductor substrate.

16 Claims, 5 Drawing Sheets

PROTECTION RING, METHOD FOR FORMING PROTECTION RING, AND SEMICONDUCTOR STRUCTURE

CROSS-REFERENCE TO RELATED APPLICATIONS

This is a continuation application of International Patent Application No. PCT/CN2022/082013, filed on Mar. 21, 2022, which claims priority to Chinese Patent Application No. 202111563365.1, filed on Dec. 20, 2021 and entitled "PROTECTION RING, METHOD FOR FORMING PROTECTION RING, AND SEMICONDUCTOR STRUCTURE". The disclosures of International Patent Application No. PCT/CN2022/082013 and Chinese Patent Application No. 202111563365.1 are incorporated by reference herein in their entireties.

BACKGROUND

In the semiconductor manufacturing process, a wafer on which integrated circuits are formed is usually cut into individual chips, and then these chips are fabricated into semiconductor packaging structures with different functions. In the chip cutting process, the stress generated by the cutting blade will cause the damage to the edges of the chips, and even cause the chips to collapse.

In the related art, a protection ring is provided on the periphery of an active device area of the chip, in order to prevent the chip from being damaged during cutting. The protection ring has the following three functions. The first function is to block the stress generated by the cutting blade to prevent cracks from generating in the active device area. The second function is to block the chemical damage to the circuit on the chip caused by the penetration of water vapor, mist, moisture and the like. The third function is to absorb minority carriers to protect the chip from the electromagnetic interference from external electrons or other noise interference.

However, the protection ring in the related art can only protect a functional structure formed on a surface of a substrate, but cannot protect a functional structure formed inside the substrate. When the protection ring in the related art is used to protect the chip, the problems, such as the stress damage, may still occur to the chip during cutting.

SUMMARY

The disclosure relates to the technical field of semiconductors, and relates to, but is not limited to, a protection ring, a method for forming a protection ring, and a semiconductor structure.

In view of this, embodiments of the disclosure provide a protection ring, a method for forming a protection ring, and a semiconductor structure.

In a first aspect, an embodiment of the disclosure provides a protection ring, which at least includes a buried protection structure.

The buried protection structure is arranged in a semiconductor substrate.

The buried protection structure is configured to protect a first functional structure formed inside the semiconductor substrate.

In a second aspect, an embodiment of the disclosure provides a method for forming a protection ring, which includes the following operations.

A semiconductor substrate is provided.

A first functional structure arranged inside the semiconductor substrate is formed, and a buried protection structure is simultaneously formed in the semiconductor substrate, in which the buried protection structure is configured to protect the first functional structure.

In a third aspect, an embodiment of the disclosure provides a semiconductor structure, which includes: a chip, and a protection ring arranged around the chip.

The protection ring is configured to protect an internal circuit structure of the chip.

The protection ring at least includes a buried protection structure arranged inside a semiconductor substrate of the chip. The internal circuit structure at least includes a first functional structure arranged inside the semiconductor substrate of the chip.

The buried protection structure is configured to protect the first functional structure.

BRIEF DESCRIPTION OF THE DRAWINGS

In the accompanying drawings (which are not necessarily drawn to scale), similar reference numerals may denote similar components in different diagrams. The similar reference numerals having different letter suffixes may denote different examples of the similar components. The accompanying drawings generally illustrate various embodiments discussed in the disclosure by way of example and not by way of limitation.

DETAILED DESCRIPTION

Figure 1:
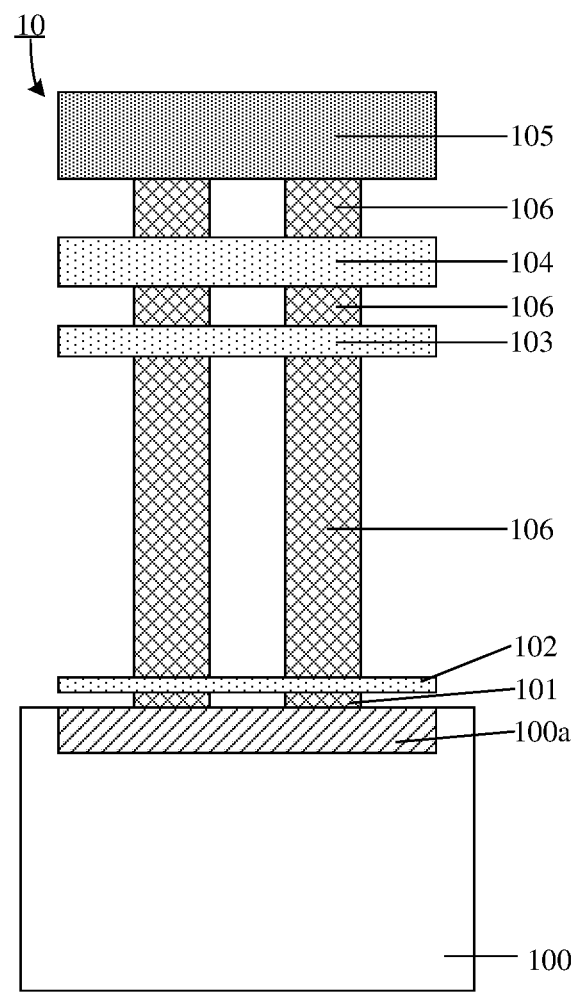
FIG. 1 is a cross-sectional view of a protection ring in the related art.

Exemplary embodiments of the disclosure will be described in more detail below with reference to the accompanying drawings. Although the exemplary embodiments of the disclosure are shown in the accompanying drawings, it should be understood that the disclosure can be implemented in various forms and cannot be limited by the embodiments illustrated herein. On the contrary, these embodiments are provided to more thoroughly understand the disclosure and to completely convey the scope of the disclosure to those skilled in the art.

In the following description, numerous specific details are set forth in order to provide a more thorough understanding of the disclosure. However, it will be apparent to those skilled in the art that the disclosure can be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, areas, and elements may be exaggerated for clarity. The same reference numerals denote the same elements throughout the disclosure.

It should be understood that, when an element or layer is described as being "on", "adjacent to", "connected to" or "coupled to" another element or layer, it can be directly on, adjacent on, connected to, or coupled to the other element or layer, or there can be an intermediate element or layer. In contrast, when an element is described as being "directly on", "directly adjacent to", "directly connected to" or "directly coupled to" another element or layer, there are no intermediate element or layer. It should be understood that although the terms "first", "second", "third" and so on may be used to describe various elements, components, areas, layers and/or portions, those elements, components, areas, layers and/or portions should not be limited by these terms. These terms are merely used to distinguish an element, component, area, layer, or portion from another element, component, area, layer, or portion. Thus, a first element, component, area, layer, or portion discussed below may be described as a second element, component, area, layer, or portion without departing from the teaching of the disclosure. When the second element, component, area, layer, or portion is discussed, it does not mean that the first element, component, area, layer, or portion is necessarily present in the disclosure.

Terms used herein are for the purpose of describing specific embodiments only and are not intended to be limiting the disclosure. As used herein, "a/an", "one", and "the/said" in singular forms are also intended to include a plural form unless the context clearly indicates other forms. It should also be understood that the terms "consist" and/or "include" when used in the description, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

FIG. 1 is a cross-sectional view of a protection ring in the related art. Before describing a protection ring according to the embodiments of the disclosure in detail, the structure of the protection ring in the related art is firstly described with reference to FIG. 1.

As shown in FIG. 1, a protection ring 10 in the related art includes a metal plug 101, a first metal layer 102, a second metal layer 103, a third metal layer 104, and a fourth metal layer 105 which are sequentially arranged on a surface of an active area 100a of a substrate 100, and through holes 106 for connecting any two adjacent metal layers with each other. It can be seen that the protection ring in the related art is formed only on the surface of the semiconductor substrate. Therefore, the protection ring in the related art can only protect a functional structure formed on the surface of the substrate. When a functional structure is formed inside the substrate, it cannot be well protected by the protection ring in the related art.

Based on the above problems existing in the related art, the embodiments of the disclosure provide a protection ring, a method for forming a protection ring, and a semiconductor structure. The protection ring at least includes a buried protection structure. The buried protection structure is arranged in a semiconductor substrate, and is configured to protect a first functional structure formed inside the semiconductor substrate. Since the protection ring according to embodiments of the disclosure at least includes a buried protection structure, the first functional structure formed inside the semiconductor substrate can be protected, so that the damage to the chip caused by the stress in the wafer cutting process can be effectively prevented, thereby improving the cutting yield of the chip.

Figure 2A:
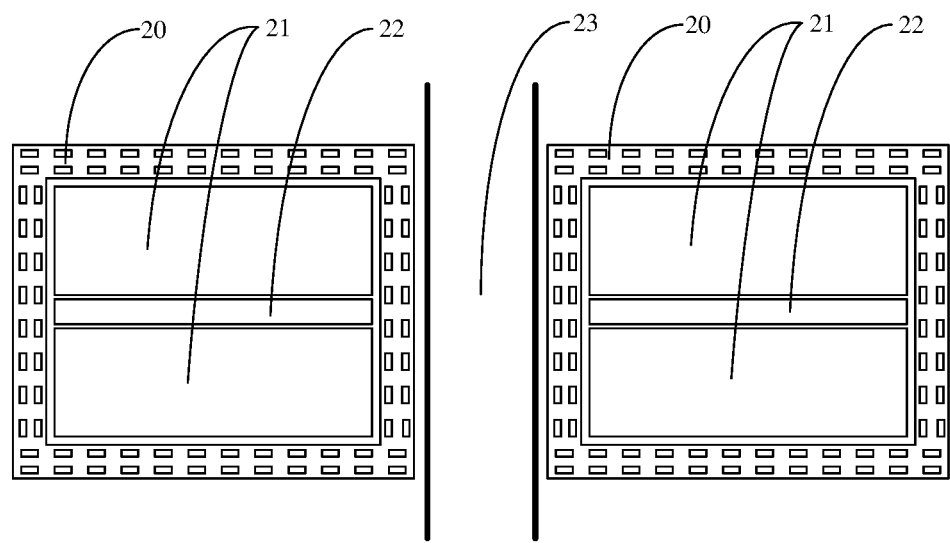
FIG. 2A is a top view of a protection ring according to an embodiment of the disclosure.
Figure 2B:
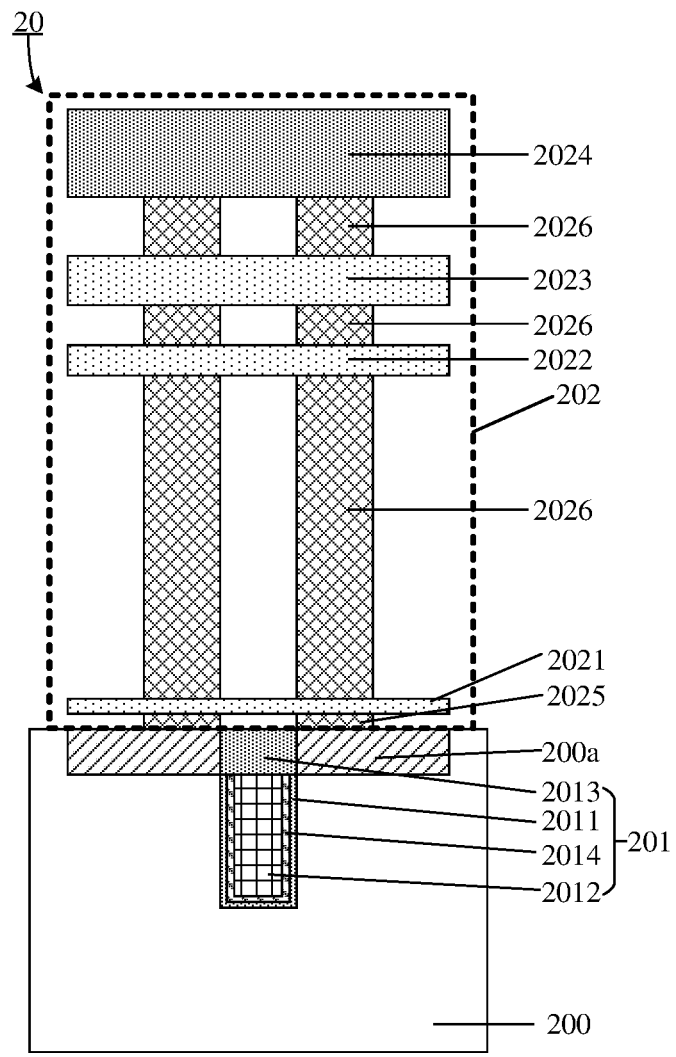
FIG. 2B is a cross-sectional view of a protection ring according to an embodiment of the disclosure.

An embodiment of the disclosure provides a protection ring. FIG. 2A is a top view of a protection ring according to an embodiment of the disclosure. FIG. 2B is a cross-sectional view of a protection ring according to an embodiment of the disclosure. As shown in FIG. 2A and FIG. 2B, a protection ring 20 is arranged in a scribe line 23 around a chip formed by an array area 21 and a peripheral circuit area 22. The protection ring 20 is at least configured to prevent the stress damage in the chip cutting process. The protection ring 20 includes a buried protection structure 201. The buried protection structure 201 is arranged in a semiconductor substrate 200. The buried protection structure 201 is configured to protect a first functional structure (not shown in the figures) formed inside the semiconductor substrate 200.

In the embodiments of the disclosure, the semiconductor substrate 200 may be a silicon substrate. The semiconductor substrate 200 may also include other semiconductor elements, such as germanium (Ge); or may include semiconductor compounds, such as silicon carbide (SiC), gallium arsenide (GaAs), gallium phosphide (GaP), indium phosphide (InP), indium arsenide (InAs), or indium antimonide (InSb); or may include other semiconductor alloys, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or a combination thereof.

In some embodiments, the buried protection structure 201 may be a buried word line protection structure. The first functional structure may be a word line structure. The buried word line protection structure is configured to protect the word line structure.

In the embodiments of the disclosure, a buried depth of the buried word line protection structure is equal to a buried depth of the word line structure, or a buried depth of the buried word line protection structure is greater than a buried depth of the word line structure, or a buried depth of the buried word line protection structure is less than a buried depth of the word line structure. When the buried depth of the buried word line protection structure is equal to the buried depth of the word line structure, the buried word line protection structure has the strongest protection effect on the word line structure.

In some embodiments, when the buried depth of the buried word line protection structure is less than the buried depth of the word line structure, the value of the buried depth of the buried word line protection structure is within a buried depth range, and the minimum value of the buried depth range is greater than 0. That is to say, the buried depth of the buried word line protection structure is at least greater than 0. In terms of process implementation, the buried depth of the buried word line protection structure should be as approximate to the buried depth of the word line structure as possible, so that the buried word line protection structure and the word line structure can be simultaneously formed. Alternatively, after the word line structure is formed, the buried depth of the buried word line protection structure is determined based on the buried depth of the formed word line structure, and then the buried word line protection structure is formed.

In some embodiments, when the buried depth of the buried word line protection structure is greater than the buried depth of the word line structure, or when the buried depth of the buried word line protection structure is less than the buried depth of the word line structure, a difference between the buried depth of the buried word line protection structure and the buried depth of the word line structure is less than or equal to a first preset depth value. When the difference between the buried depth of the buried word line protection structure and the buried depth of the word line structure is greater than the first preset depth value, the buried word line protection structure cannot protect the word line structure.

In the embodiments of the disclosure, a structure of the word line structure is the same as a structure of the buried word line protection structure. With reference to FIG. 2B, the structure of the buried word line protection structure at least includes a gate dielectric layer 2011, a word line metal layer 2012, and a gate protection pattern 2013. The gate dielectric layer 2011 is arranged between the word line metal layer 2012 and the semiconductor substrate 200. The gate protection pattern 2013 is arranged on a top surface of the gate dielectric layer 2011 and a top surface of the word line metal layer 2012. A top surface of the semiconductor substrate 200 is flush with a top surface of the gate protection pattern 2013, or a top surface of the semiconductor substrate 200 is higher than a top surface of the gate protection pattern 2013.

In some embodiments, the gate dielectric layer 2011 may be a silicon oxide layer, a thermal oxide layer, or a high-k dielectric layer, etc., such as a silicon oxide layer. The word line metal layer 2012 may be made of a conductive material, such as a doped polycrystalline silicon material, a metal material (such as metal tungsten), or a metal silicide material. The gate protection pattern 2013 may be any insulating layer, such as a silicon oxide layer.

In some embodiments, with reference to FIG. 2B, the buried word line protection structure further includes a word line blocking layer 2014. The word line blocking layer 2014 is arranged between the gate dielectric layer 2011 and the word line metal layer 2012. The word line blocking layer 2014 is configured to prevent the metal material in the word line metal layer 2012 from diffusing into the semiconductor substrate 200.

In some embodiments, the word line blocking layer 2014 may be a titanium nitride layer, a tungsten nitride layer, or a tantalum nitride layer, etc.

In some embodiments, the buried protection structure 201 may also be a buried bit line protection structure. The first functional structure may also be a bit line structure. The buried bit line protection structure is configured to protect the bit line structure.

In the embodiments of the disclosure, a buried depth of the buried bit line protection structure is equal to a buried depth of the bit line structure, or a buried depth of the buried bit line protection structure is greater than a buried depth of the bit line structure, or a buried depth of the buried bit line protection structure is less than a buried depth of the bit line structure. When the buried depth of the buried bit line protection structure is the equal to the buried depth of the bit line structure, the buried bit line protection structure has the strongest protection effect on the bit line structure.

In some embodiments, when the buried depth of the buried bit line protection structure is less than the buried depth of the bit line structure, the value of the buried depth of the buried bit line protection structure is within a buried depth range, and the minimum value of the buried depth range is greater than 0. That is to say, the buried depth of the buried bit line protection structure is at least greater than 0. In terms of process implementation, the buried depth of the buried bit line protection structure should be as approximate to the buried depth of the bit line structure as possible, so that the buried bit line protection structure and the bit line structure can be simultaneously formed. Alternatively, after the bit line structure is formed, the buried depth of the buried bit line protection structure is determined based on the buried depth of the formed bit line structure, and then the buried bit line protection structure is formed.

In some embodiments, when the buried depth of the buried bit line protection structure is greater than the buried depth of the bit line structure, or when the buried depth of the buried bit line protection structure is less than the buried depth of the bit line structure, a difference between the buried depth of the buried bit line protection structure and the buried depth of the bit line structure is less than or equal to a second preset depth value. When the difference between the buried depth of the buried bit line protection structure and the buried depth of the bit line structure is greater than the second preset depth value, the buried bit line protection structure cannot protect the bit line structure.

In some embodiments, a structure of the bit line structure is the same as a structure of the buried bit line protection structure. The structure of the buried bit line protection structure at least includes a bit line metal layer. The top surface of the semiconductor substrate is higher than a top surface of the bit line metal layer.

In some embodiments, the buried bit line protection structure may be electrically connected through an internal potential component or an external potential component of one or more metal layers.

In some embodiments, the buried bit line protection structure further includes a bit line blocking layer. The bit line blocking layer is arranged between the bit line metal layer and the semiconductor substrate. The bit line blocking layer is configured to prevent the metal material in the bit line metal layer from diffusing into the semiconductor substrate.

In some embodiments, with reference to FIG. 2B, the protection ring 20 further includes a non-buried protection structure 202. The non-buried protection structure 202 is arranged on the surface of the semiconductor substrate 200. The non-buried protection structure 202 is electrically connected to the semiconductor substrate 200. The non-buried protection structure 202 is configured to protect a second functional structure (not shown in FIG. 2B) formed on the surface of the semiconductor substrate 200.

In some embodiments, the second functional structure may be a capacitor structure.

In the embodiments of the disclosure, the non-buried protection structure includes: at least two metal layers, at least one first through hole, and a metal plug. The first through hole is configured to electrically connect two adjacent metal layers with each other. The metal plug is configured to electrically connect a bottommost metal layer in the non-buried protection structure with the semiconductor substrate. The at least two metal layers, the at least one first through hole, and the metal plug are configured to protect the capacitor structure.

In some embodiments, a height of the non-buried protection structure may be greater than a height of the capacitor structure.

With reference to FIG. 2B, the non-buried protection structure 202 includes a first metal layer 2021, a second metal layer 2022, a third metal layer 2023, a fourth metal layer 2024, a metal plug 2025 for connecting an active area 200a in the semiconductor substrate 200 and the first metal layer 2021, and first through holes 2026 each for connecting two adjacent metal layers with each other.

In some embodiments, the active area 200a may be formed in the semiconductor substrate 200, and may be arranged below the surface of the semiconductor substrate 200. A thickness of the active area 200a in a direction perpendicular to the surface of the substrate is equal to a thickness of the gate protection pattern 2013, or a thickness of the active area 200a in a direction perpendicular to the surface of the substrate is greater than a thickness of the gate protection pattern 2013, or a thickness of the active area 200a in a direction perpendicular to the surface of the substrate is less than a thickness of the gate protection pattern 2013. An upper surface of the active area 200a, an upper surface of the gate protection pattern 2013, and an upper surface of the semiconductor substrate 200 are coplanar. That is to say, the upper surface of the active area 200a, the upper surface of the gate protection pattern 2013, and the upper surface of the semiconductor substrate 200 are located in the same plane.

In some embodiments, the protection ring may further include a second through hole. The second through hole is configured to electrically connect the bottommost metal layer in the non-buried protection structure with the word line metal layer 2012.

In the embodiments of the disclosure, the protection ring is formed around a semiconductor chip. The semiconductor chip includes, but is not limited to, any one of the following: a Dynamic Random Access Memory (DRAM) chip, a Static Random Access Memory (SRAM) chip, a Phase Change Memory (PCM) chip, an Ferroelectric Random Access Memory (FeRAM) chip, a Resistive Random Access Memory (ReRAM) chip, or a flash chip.

In the embodiments of the disclosure, the protection ring may be grounded or may be connected to a negative voltage through the metal layer. In other embodiments, the protection ring may be not connected to any metal layer or potential.

Figure 3A:
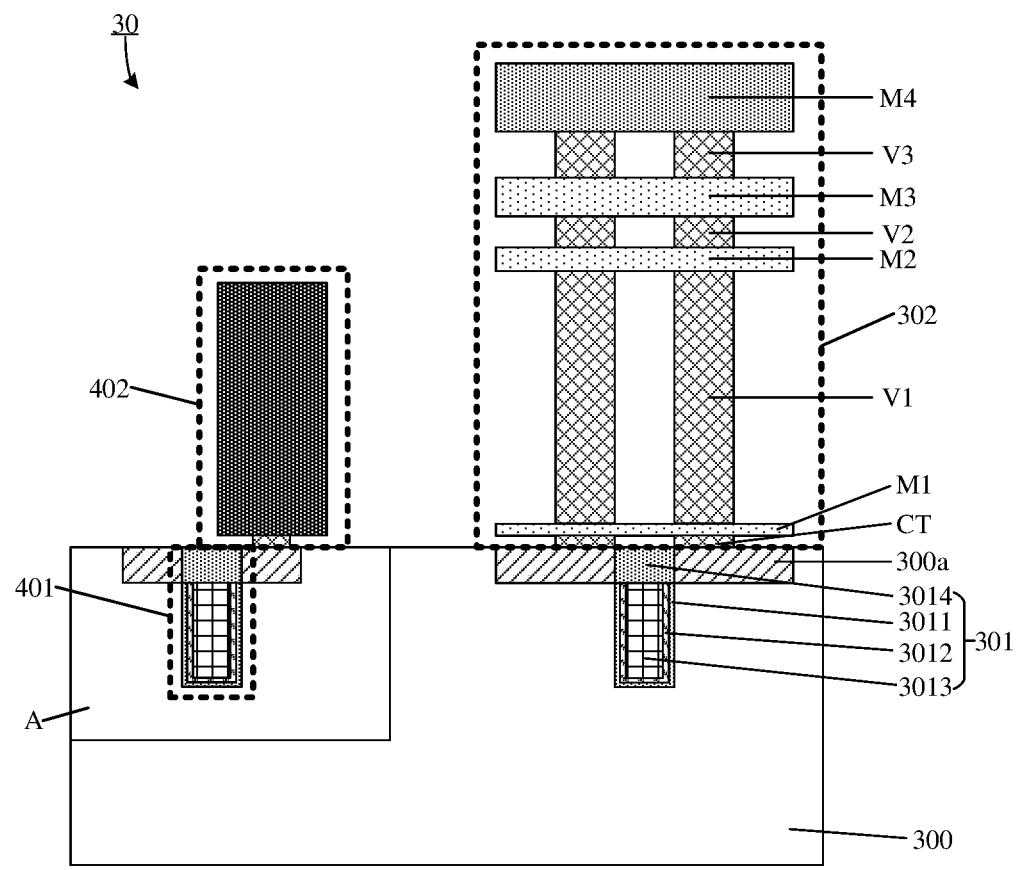
FIG. 3A and FIG. 3B are cross-sectional views of a protection ring of a DRAM chip according to an embodiment of the disclosure.
Figure 3B:
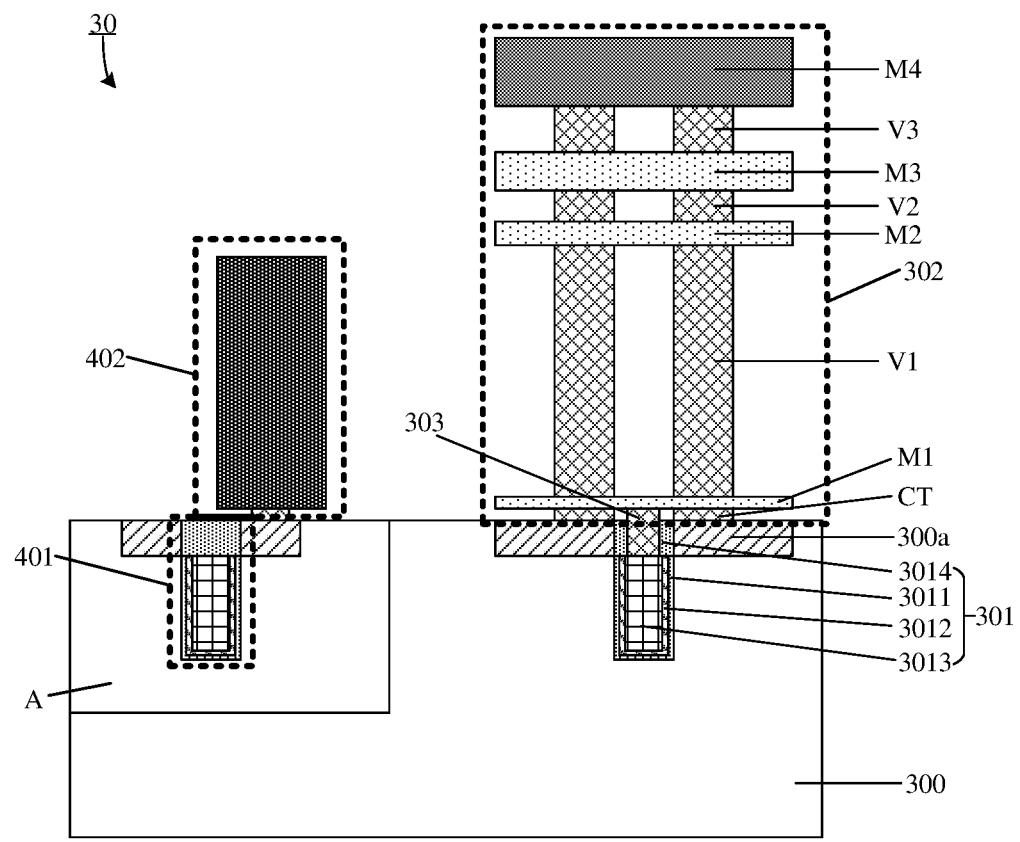

The DRAM chip is taken as an example below for illustrating the structure of the protection ring arranged around the DRAM chip. FIG. 3A and FIG. 3B are cross-sectional views of a protection ring of a DRAM chip according to an embodiment of the disclosure. As shown in FIG. 3A and FIG. 3B, a protection ring 30 of the DRAM chip includes a buried protection structure 301 and a non-buried protection structure 302. The buried protection structure 301 is configured to protect a first functional structure 401 formed inside a semiconductor substrate 300. The non-buried protection structure 302 is configured to protect a second functional structure 402 formed on a surface of the semiconductor substrate 300.

With reference to FIG. 3A and FIG. 3B, the buried protection structure 301 includes a buried word line protection structure. The first functional structure 401 includes a word line structure arranged in an array area A. In the embodiments of the disclosure, a structure of the buried word line protection structure is the same as a structure of the word line structure, and a buried depth of the buried word line protection structure is equal to a buried depth of the word line structure. Each of the buried word line protection structure and the word line structure includes a gate dielectric layer 3011, a word line blocking layer 3012, a word line metal layer 3013, and a gate protection pattern 3014. The gate dielectric layer 3011 is arranged between the word line metal layer 3013 and the semiconductor substrate 300. The word line blocking layer 3012 is arranged between the gate dielectric layer 3011 and the word line metal layer 3013. The gate protection pattern 3014 is arranged on a top surface of the gate dielectric layer 3011, a top surface of the word line blocking layer 3012, and a top surface of the word line metal layer 3013. A top surface of the gate protection pattern 3014 is flush with a top surface of the semiconductor substrate 300.

In the embodiments of the disclosure, the gate dielectric layer may be a silicon oxide layer, a thermal oxide layer, or a high-k dielectric layer, such as a silicon oxide layer. The word line blocking layer may be a titanium nitride layer, a tungsten nitride layer, or a tantalum nitride layer. The word line metal layer may be made of a conductive material, such as a doped polycrystalline silicon material, a metal material (such as metal tungsten), or a metal silicide material. The gate protection pattern may be any insulating layer, such as a silicon oxide layer.

With reference to FIG. 3A and FIG. 3B, the non-buried protection structure 302 includes a first metal layer M1, a second metal layer M2, a third metal layer M3, a fourth metal layer M4, a metal plug CT for connecting an active area 300a in the semiconductor substrate 300 and the first metal layer M1, a first through hole V1 for connecting M1 and M2, a first through hole V2 for connecting M2 and M3, and a first through hole V3 for connecting M3 and M4. In the embodiments of the disclosure, the second functional structure 402 includes a capacitor structure arranged on a surface of an array area A. Moreover, in the embodiments of the disclosure, a height of the non-buried protection structure 302 is greater than a height of the capacitor structure. The first through hole V1 for connecting the first metal layer M1 and the second metal layer M2 is simultaneously formed with the capacitor structure, and a height of the first through hole V1 for connecting the first metal layer M1 and the second metal layer M2 is equal to a height of the capacitor structure.

In some embodiments, with reference to FIG. 3B, the protection ring 30 of the DRAM chip further includes a second through hole 303. The second through hole 303 is configured to electrically connect a bottommost metal layer (i.e., the first metal layer M1) in the non-buried protection structure 302 with the word line metal layer 3013.

In the embodiments of the disclosure, a gate (i.e., the word line metal layer in the buried word line protection structure) of a buried Metal-Oxide-Semiconductor (MOS) field-effect structure in the buried protection structure of the protection ring of the DRAM chip may be floated, or may be electrically connected to the first metal layer M1 in the non-buried protection structure. When the protection ring of the DRAM chip is grounded, the shielding effect against noise or the electromagnetic interference may be better.

The stress conduction in the chip cutting process is analyzed below with reference to FIG. 3A and FIG. 3B, in the cutting process, M4-V3-M3-V2-M2-V1-M1-CT arranged on the surface of the substrate may protect the capacitor structure on the surface of the array area A. When the semiconductor substrate is cut, the stress conducted through the semiconductor substrate 300 is resisted by the buried word line protection structure 301 buried in the semiconductor substrate, so as to protect the MOS structure (i.e., the word line structure 401 in the disclosure) inside the semiconductor substrate 300.

In the embodiments of the disclosure, the protection ring is arranged adjacent to the array area, a gate of a buried MOS in a protection ring area is made of tungsten and titanium nitride (TiN) with higher hardness, and a buried depth of a buried MOS structure in the protection ring area is equal to a buried depth of an MOS structure in the array area. Therefore, the stress or cracks conducted to the array area through the semiconductor substrate can be effectively prevented.

In the embodiments of the disclosure, the protection ring at least includes a buried protection structure, so as to protect a first functional structure formed inside the semiconductor substrate, so that the damage to the chip caused by the stress in the wafer cutting process can be effectively prevented, thereby improving the cutting yield of the chip.

Figure 4:
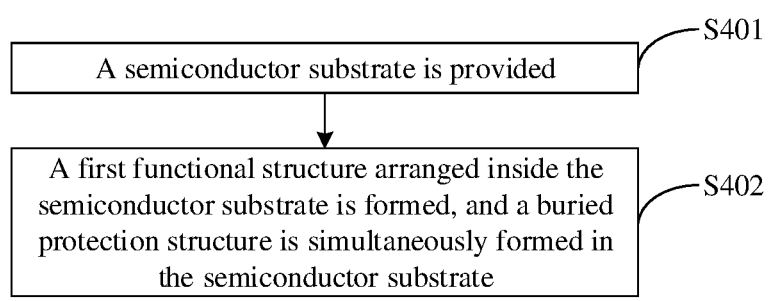
FIG. 4 is a flowchart of a method for forming a protection ring according to an embodiment of the disclosure.

An embodiment of the disclosure provides a method for forming a protection ring. FIG. 4 is a flowchart of a method for forming a protection ring according to an embodiment of the disclosure. As shown in FIG. 4, the method for forming the protection ring includes the following operations.

In S401, a semiconductor substrate is provided.

In embodiments of the disclosure, the semiconductor substrate may be a silicon substrate. The semiconductor substrate may also include other semiconductor elements, such as germanium (Ge); or may include semiconductor compounds, such as silicon carbide (SiC), gallium arsenide (GaAs), gallium phosphide (GaP), indium phosphide (InP), indium arsenide (InAs), or indium antimonide (InSb); or may include other semiconductor alloys, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or a combination thereof.

In S402, a first functional structure arranged inside the semiconductor substrate is formed, and a buried protection structure is simultaneously formed in the semiconductor substrate.

The buried protection structure is configured to protect the first functional structure.

In the embodiments of the disclosure, the buried protection structure and the first functional structure have a same buried depth or different buried depths. For example, the buried depth of the buried protection structure is greater than the buried depth of the first functional structure, or the buried depth of the buried protection structure is less than the buried depth of the first functional structure.

In some embodiments, the first functional structure and the buried protection structure may be simultaneously formed through a same process.

In the embodiments of the disclosure, the first functional structure may be a word line structure or a bit line structure. A structure of the buried protection structure is the same as a structure of the first functional structure. For example, the buried protection structure may be a buried word line structure or a buried bit line structure.

In some embodiments, when the first functional structure includes a word line structure, and the buried protection structure includes a buried word line, the buried protection structure may be formed through the following operations.

In S1, an etched recess is formed inside the semiconductor substrate.

In S2, an initial gate dielectric layer, an initial word line blocking layer, and an initial word line metal layer are sequentially formed on an inner wall of the etched recess, in which the etched recess is filled with the initial word line metal layer.

In the embodiments of the disclosure, the initial gate dielectric layer, the initial word line blocking layer, and the initial word line metal layer may be formed through any suitable deposition process, such as a Chemical Vapor Deposition (CVD) process, a Physical Vapor Deposition (PVD) process, an Atomic Layer Deposition (ALD) process, a spin coating process, or a coating process.

In S3, the initial gate dielectric layer, the initial word line blocking layer, and the initial word line metal layer are etched back to form a gate dielectric layer, a word line blocking layer, and a word line metal layer.

In S4, a gate insulating layer is formed on a top surface of the gate dielectric layer, a top surface of the word line blocking layer, and a top surface of the word line metal layer.

In the embodiments of the disclosure, the gate insulating layer may be formed through any suitable deposition process.

In some embodiments, the method for forming the protection ring further includes the following operation. A non-buried protection structure and a second functional structure are formed on a surface of the semiconductor substrate.

The non-buried protection structure is configured to protect the second functional structure formed on the surface of the semiconductor substrate.

In some embodiments, the second functional structure includes a capacitor structure. The non-buried protection structure includes at least two metal layers, at least one first through hole, and a metal plug. The first through hole is configured to electrically connect two adjacent metal layers with each other. The metal plug is configured to electrically connect a bottommost metal layer in the non-buried protection structure with the semiconductor substrate. The at least two metal layers, the at least one first through hole, and the metal plug are configured to protect the capacitor structure.

It should be noted that in the embodiments of the disclosure, a height of the non-buried protection structure is greater than a height of the capacitor structure. The first through hole between the first layer of metal layer and the second layer of metal layer of the at least two metal layers are simultaneously formed with the capacitor structure, and a height of the first through hole between the first layer of metal layer and the second layer of metal layer is equal to a height of the capacitor structure.

According to the method for forming the protection ring in the embodiments of the disclosure, the buried protection structure is formed, while forming the first functional structure in the semiconductor substrate. Thus, no additional process operation should be added in the forming process of the protection ring.

The method for forming the protection ring provided in the embodiments of the disclosure is similar to the protection ring in the above embodiments. For the technical features which are not disclosed in detail in the embodiments of the disclosure, they can be understood referring to the above embodiments, which are not repeated herein.

Figure 5A:
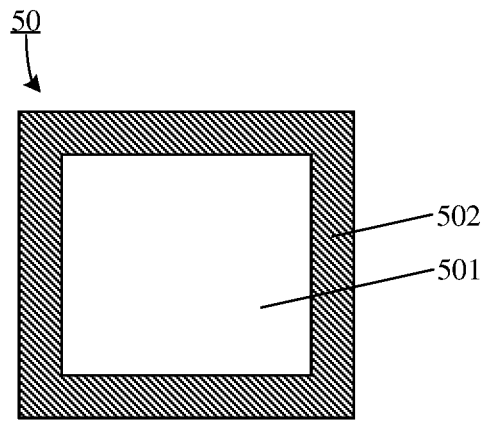
FIG. 5A is a top view of a semiconductor structure according to an embodiment of the disclosure.
Figure 5B:
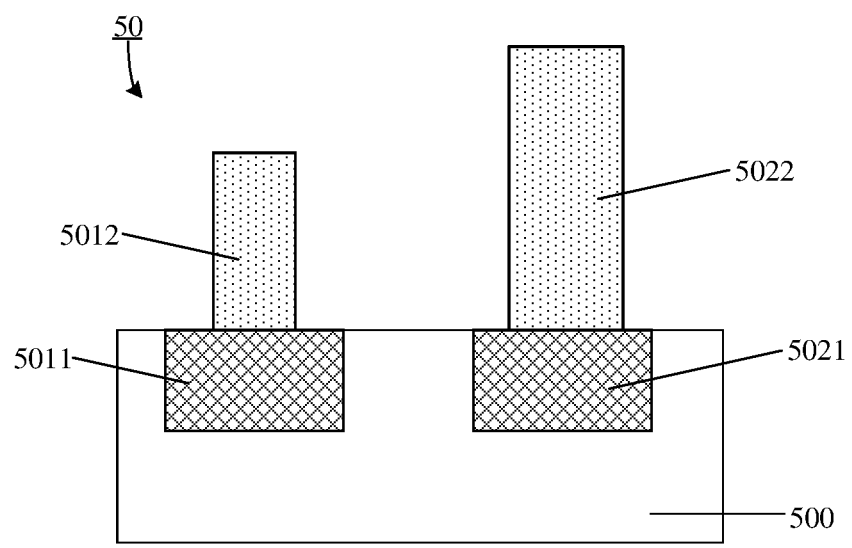
FIG. 5B is a cross-sectional view of a semiconductor structure according to an embodiment of the disclosure.

In addition, an embodiment of the disclosure also provides a semiconductor structure. FIG. 5A is a top view of a semiconductor structure according to an embodiment of the disclosure. FIG. 5B is a cross-sectional view of a semiconductor structure according to an embodiment of the disclosure. As shown in FIG. 5A and FIG. 5B, a semiconductor structure 50 includes a chip 501 and a protection ring 502 arranged around the chip 501. The protection ring 502 is configured to protect an internal circuit structure of the chip. The protection ring 502 at least includes a buried protection structure 5021 arranged inside a semiconductor substrate 500. The internal circuit structure at least includes a first functional structure 5011 arranged inside the semiconductor substrate 500 of the chip 501. The buried protection structure 5021 is configured to protect the first functional structure 5011.

In some embodiments, the first functional structure 5011 may be a word line structure or a bit line structure. The buried protection structure 5021 may be a buried word line protection structure or a buried bit line protection structure.

In the embodiments of the disclosure, a structure of the buried word line protection structure is the same as a structure of the word line structure, and a buried depth of the buried word line protection structure is the same or different from a buried depth of the word line structure. A structure of the buried bit line protection structure is the same as a structure of the bit line structure, and a buried depth of the buried bit line protection structure is the same or different from a buried depth of the bit line structure.

The buried word line protection structure is a tungsten metal structure (with reference to FIG. 3B). The buried word line protection structure and the word line structure are made of the same material. The word line metal layer in the buried word line protection structure may be externally connected to a potential. The word line metal layer in the buried word line protection structure is externally connected to a potential through metal layers such as the first metal layer M1, the second metal layer M2, the third metal layer M3, and the fourth metal layer M4, so as to apply a voltage to the word line metal layer to form a negative potential on the word line metal layer and absorb holes in the semiconductor substrate through the absorption of the negative potential, thereby reducing the influence of the electromagnetic interference or other noise on the semiconductor chip, which is beneficial to stabilize the performance of a semiconductor device. The external potential can be adjusted by a temperature sensor. In the case of higher temperature, the higher the temperature is, the greater the electron energy is. Therefore, the potential of the word line metal layer can be reduced, so as to improve the ability to absorb minority carriers in the semiconductor substrate, thereby reducing the influence of the electromagnetic interference or other noise on the finally formed semiconductor chip. In the case of lower temperature, the potential of the word line metal layer can be increased to increase the number of electrons, so as to improve the ability to absorb minority carriers in the semiconductor substrate, thereby reducing the influence of the electromagnetic interference or other noise on the finally formed semiconductor chip.

In some embodiments, the protection ring 502 arranged around the chip 501 may also be grounded. In this way, minority carriers can be further absorbed to reduce the influence of the electromagnetic interference or other noise on the semiconductor chip.

With reference to FIG. 5B, the protection ring 502 further includes a non-buried protection structure 5022 arranged on the surface of the semiconductor substrate 500. The internal circuit structure further includes a second functional structure 5012 arranged on the surface of the semiconductor substrate 500 of the chip. The non-buried protection structure 5022 is configured to protect the second functional structure 5012.

In some embodiments, the second functional structure 5012 may be a capacitor structure. The non-buried protection structure 5022 includes at least two metal layers, at least one first through hole, and a metal plug. The at least two metal layers, the at least one first through hole, and the metal plug are configured to protect the capacitor structure.

In embodiments of the disclosure, a height of the non-buried protection structure is greater than a height of the capacitor structure.

In some embodiments, the protection ring further includes a second through hole. The second through hole is configured to electrically connect a bottommost metal layer in the non-buried protection structure with the buried word line protection structure.

In embodiments of the disclosure, the chip of the semiconductor structure may be a DRAM chip, an SRAM chip, a PCM chip, an FeRAM chip, a ReRAM chip, or a flash chip.

The protection ring in the semiconductor structure in the embodiments of the disclosure is similar to the protection ring in the above embodiments. For the technical features which are not disclosed in detail in the embodiments of the disclosure, they can be understood referring to the above embodiments, which are not repeated herein.

According to the semiconductor structure provided in the embodiments of the disclosure, the semiconductor structure includes a protection ring, and the protection ring includes a buried protection structure. Thus, the protection ring can protect the first functional structure formed inside the semiconductor substrate, and thus the protection ring can well protect the chip in the semiconductor structure.

In the several embodiments provided in the disclosure, it should be understood that the disclosed device and method may be implemented in non-target manners. The described device embodiments are merely exemplary. For example, the unit division is merely logical function division and may be other division in an actual implementation. For example, multiple units or components may be combined or integrated into another system, or some features may be ignored or not performed. Furthermore, the displayed or discussed components may be coupled or directly coupled to each other.

The units described above as separate components may or may not be physically separated. Components illustrated as units may or may not be physical units, that is, may be located in one place or may be distributed over multiple network units. Part or all of these units may be selected according to practical requirements to achieve the objectives of the solution of the embodiments.

Features disclosed in several method or device embodiments provided in the disclosure may be combined arbitrarily to obtain new method embodiments or device embodiments without conflict.

The above descriptions are merely some implementations of the embodiments of the disclosure, and are not intended to limit the protection scope of the embodiments of the disclosure. It is easy for those skilled in the art to convince modifications or substitutions within the technical scope disclosed in the embodiments of the disclosure. These modifications or substitutions are within the protection scope of the embodiments of the disclosure. Therefore, the protection scope of the embodiments of the disclosure is subject to the protection scope of the claims.

The invention claimed is:

1. A protection ring, at least comprising a buried protection structure,
   wherein the buried protection structure is arranged in a semiconductor substrate; and
   wherein the buried protection structure is configured to protect a first functional structure formed inside the semiconductor substrate;
   wherein the buried protection structure comprises a buried word line protection structure, and the first functional structure comprises a word line structure; and the buried word line protection structure is configured to protect the word line structure;

wherein a buried depth of the buried word line protection structure is equal to a buried depth of the word line structure, or a buried depth of the buried word line protection structure is greater than a buried depth of the word line structure, or a buried depth of the buried word line protection structure is less than a buried depth of the word line structure;

wherein a structure of the word line structure is the same as a structure of the buried word line protection structure, and the structure of the buried word line protection structure at least comprises a gate dielectric layer, a word line metal layer, and a gate protection pattern;

wherein the gate dielectric layer is arranged between the word line metal layer and the semiconductor substrate;

wherein the gate protection pattern is arranged on a top surface of the gate dielectric layer and a top surface of the word line metal layer; and wherein a top surface of the semiconductor substrate is flush with a top surface of the gate protection pattern, or a top surface of the semiconductor substrate is higher than a top surface of the gate protection pattern.

2. The protection ring of claim 1, wherein the buried protection structure comprises a buried bit line protection structure, and the first functional structure comprises a bit line structure; and the buried bit line protection structure is configured to protect the bit line structure.

3. The protection ring of claim 2, wherein a buried depth of the buried bit line protection structure is equal to a buried depth of the bit line structure, or a buried depth of the buried bit line protection structure is greater than a buried depth of the bit line structure, or a buried depth of the buried bit line protection structure is less than a buried depth of the bit line structure.

4. The protection ring of claim 3, wherein a structure of the bit line structure is the same as a structure of the buried bit line protection structure; and the structure of the buried bit line protection structure at least comprises a bit line metal layer, wherein a top surface of the semiconductor substrate is higher than a top surface of the bit line metal layer.

5. The protection ring of claim 2, wherein the buried bit line protection structure is electrically connected to an internal potential component or an external potential component through one or more metal layers.

6. The protection ring of claim 1, further comprising a non-buried protection structure;

wherein the non-buried protection structure is arranged on a surface of the semiconductor substrate, and is electrically connected to the semiconductor substrate; and wherein the non-buried protection structure is configured to protect a second functional structure formed on the surface of the semiconductor substrate.

7. The protection ring of claim 6, wherein the non-buried protection structure comprises: at least two metal layers, at least one first through hole, and a metal plug;

the at least one first through hole is configured to electrically connect two adjacent metal layers of the at least two metal layers with each other; and the metal plug is configured to electrically connect a bottommost metal layer of the at least two metal layers in the non-buried protection structure with the semiconductor substrate.

8. The protection ring of claim 7, wherein the second functional structure comprises a capacitor structure; and the at least two metal layers, the at least one first through hole, and the metal plug are configured to protect the capacitor structure.

9. The protection ring of claim 8, wherein a height of the non-buried protection structure is greater than a height of the capacitor structure.

10. The protection ring of claim 7, further comprising a second through hole;

wherein the buried protection structure comprises a buried word line protection structure, and a structure of the buried word line protection structure comprises a word line metal layer; and wherein the second through hole is configured to electrically connect a bottommost metal layer of the at least two metal layers in the non-buried protection structure with the word line metal layer.

11. The protection ring of claim 1, wherein the protection ring is formed around a semiconductor chip; and the semiconductor chip comprises a dynamic random access memory chip, a static random access memory chip, a phase change memory chip, a ferroelectric random access memory chip, a resistive random access memory chip, or a flash chip.

12. A method for forming a protection ring, comprising:
providing a semiconductor substrate; and
forming a first functional structure arranged inside the semiconductor substrate, and simultaneously forming a buried protection structure in the semiconductor substrate, wherein the buried protection structure is configured to protect the first functional structure;

wherein the buried protection structure comprises a buried word line protection structure, and the first functional structure comprises a word line structure; and the buried word line protection structure is configured to protect the word line structure;

wherein a buried depth of the buried word line protection structure is equal to a buried depth of the word line structure, or a buried depth of the buried word line protection structure is greater than a buried depth of the word line structure, or a buried depth of the buried word line protection structure is less than a buried depth of the word line structure;

wherein a structure of the word line structure is the same as a structure of the buried word line protection structure, and the structure of the buried word line protection structure at least comprises a gate dielectric layer, a word line metal layer, and a gate protection pattern;

wherein the gate dielectric layer is arranged between the word line metal layer and the semiconductor substrate;

wherein the gate protection pattern is arranged on a top surface of the gate dielectric layer and a top surface of the word line metal layer; and wherein a top surface of the semiconductor substrate is flush with a top surface of the gate protection pattern, or a top surface of the semiconductor substrate is higher than a top surface of the gate protection pattern.

13. The method for forming the protection ring of claim 12, wherein the first functional structure and the buried protection structure are simultaneously formed through a same process.

14. The method for forming the protection ring of claim 12, further comprising:
forming a non-buried protection structure on a surface of the semiconductor substrate,
wherein the non-buried protection structure is configured to protect a second functional structure formed on the surface of the semiconductor substrate.

15. The method for forming the protection ring of claim 14, wherein the second functional structure comprises a capacitor structure.

16. A semiconductor structure, comprising: a chip, and a protection ring arranged around the chip,
   wherein the protection ring is configured to protect an internal circuit structure of the chip;
   wherein the protection ring at least comprises a buried protection structure arranged inside a semiconductor substrate of the chip, and the internal circuit structure at least comprises a first functional structure arranged inside the semiconductor substrate of the chip; and
   wherein the buried protection structure is configured to protect the first functional structure;
   wherein the buried protection structure comprises a buried word line protection structure, and the first functional structure comprises a word line structure; and
   the buried word line protection structure is configured to protect the word line structure;
   wherein a buried depth of the buried word line protection structure is equal to a buried depth of the word line structure, or a buried depth of the buried word line protection structure is greater than a buried depth of the word line structure, or a buried depth of the buried word line protection structure is less than a buried depth of the word line structure;
wherein a structure of the word line structure is the same as a structure of the buried word line protection structure, and the structure of the buried word line protection structure at least comprises a gate dielectric layer, a word line metal layer, and a gate protection pattern;
wherein the gate dielectric layer is arranged between the word line metal layer and the semiconductor substrate;
wherein the gate protection pattern is arranged on a top surface of the gate dielectric layer and a top surface of the word line metal layer; and
wherein a top surface of the semiconductor substrate is flush with a top surface of the gate protection pattern, or a top surface of the semiconductor substrate is higher than a top surface of the gate protection pattern.

* * * * *